United States Patent
Reed et al.

(10) Patent No.: US 10,311,508 B2
(45) Date of Patent: Jun. 4, 2019

(54) GARMENT MODELING SIMULATION SYSTEM AND PROCESS

(71) Applicants: FashPose, LLC, Frisco, TX (US); THE TEXAS A&M UNIVERSITY SYSTEM, College Station, TX (US); Waymon B. Reed, Frisco, TX (US); Chris C. Ritchie, Austin, TX (US); Ergun Akleman, College Station, TX (US)

(72) Inventors: Waymon B. Reed, Frisco, TX (US); Chris C. Ritchie, Austin, TX (US); Ergun Akleman, College Station, TX (US)

( * ) Notice: Subject to any disclaimer, the term of this patent is extended or adjusted under 35 U.S.C. 154(b) by 790 days.

(21) Appl. No.: 14/421,836

(22) PCT Filed: Aug. 15, 2013

(86) PCT No.: PCT/US2013/055103
§ 371 (c)(1),
(2) Date: Feb. 15, 2015

(87) PCT Pub. No.: WO2014/028714
PCT Pub. Date: Feb. 20, 2014

(65) Prior Publication Data
US 2015/0235305 A1 Aug. 20, 2015

Related U.S. Application Data

(63) Continuation of application No. 13/586,845, filed on Aug. 15, 2012, now abandoned, which is a (Continued)

(51) Int. Cl.
*G06Q 30/06* (2012.01)
*G06K 9/62* (2006.01)
(Continued)

(52) U.S. Cl.
CPC ......... *G06Q 30/0643* (2013.01); *A41H 3/007* (2013.01); *G06F 17/5009* (2013.01);
(Continued)

(58) Field of Classification Search
CPC ............ G06F 17/5009; G06F 17/5086; G06F 2217/32; G06T 15/00; G06T 17/00;
(Continued)

(56) References Cited

U.S. PATENT DOCUMENTS

| 8,525,847 B2* | 9/2013 | Reid .................. G06K 9/00234 345/581 |
| 2004/0239963 A1* | 12/2004 | Terashita ............. H04N 1/2112 358/1.9 |
| 2005/0154487 A1* | 7/2005 | Wang ...................... A41H 1/00 700/132 |

(Continued)

*Primary Examiner* — Eunhee Kim
(74) *Attorney, Agent, or Firm* — John Lindsay

(57) ABSTRACT

The present invention is directed to a system and method of simulating modeling a garment, comprising the steps of receiving a user image, a garment selection, and a user profile. A photo extraction module extracts the head and neck region from the user image. A colorization module extracts color frequency data from the user image for application to a base figure framework. The system selects and scales a base figure framework in response to user profile input. A stitching module joins said extracted head and neck region to the neck region of the selected base figure framework to output a base user model. A model display module overlays and scales the selected garment on the base user model. The model display module renders a near three dimensional user model, shading the user model based on colorization module data, whereby the system simulates the user wearing the selected garment.

5 Claims, 19 Drawing Sheets

Related U.S. Application Data continuation of application No. 13/733,865, filed on Jan. 3, 2013, now abandoned.

(51) Int. Cl.
*A41H 3/00* (2006.01)
*G06T 17/00* (2006.01)
*G06F 17/50* (2006.01)

(52) U.S. Cl.
CPC .............. *G06K 9/62* (2013.01); *G06T 17/00* (2013.01); *G06T 2210/16* (2013.01)

(58) Field of Classification Search
CPC .......... G06T 2210/16; A47F 2007/195; G06Q 30/0643; G06Q 30/0601; G06K 9/62; A41H 3/007
USPC ................. 703/1, 6; 705/26.1, 26.5, 27.2
See application file for complete search history.

(56) References Cited

U.S. PATENT DOCUMENTS

| | | | |
|---|---|---|---|
| 2005/0234782 A1* | 10/2005 | Schackne | G06Q 30/0601 705/26.1 |
| 2006/0204056 A1* | 9/2006 | Steinberg | G06T 5/00 382/118 |
| 2010/0030578 A1* | 2/2010 | Siddique | G06Q 10/0637 705/3 |
| 2010/0306082 A1* | 12/2010 | Wolper | G06Q 30/0603 705/27.2 |
| 2011/0141101 A1* | 6/2011 | Scribner | G06T 19/00 345/419 |
| 2011/0234581 A1* | 9/2011 | Eikelis | G06K 9/00228 345/419 |
| 2011/0246329 A1 | 10/2011 | Geisner et al. | |
| 2013/0044958 A1* | 2/2013 | Brandt | G06T 5/005 382/201 |
| 2014/0225888 A1* | 8/2014 | Bell | G06T 17/00 345/419 |

\* cited by examiner

GARMENT MODELING SIMULATION SYSTEM AND PROCESS

PRIORITY

The present invention claims priority to nonprovisional application Ser. No. 13/586,845, now abandoned, which has a filing date of Aug. 15, 2012, and nonprovisional application Ser. No. 13/733,865, now abandoned, which has a filing date of Jan. 3, 2013, which are hereby incorporated by reference.

BACKGROUND

Field of the Invention

The present invention relates to a garment modeling simulation system, more specifically to a garment modeling simulation system with based on a user provided image.

Description of the Related Art

Clothing consumers seek to know how a particular garment will appear on them prior to purchase. At a physical retail location, that consumer may try on the clothing. The consumer enters a dressing room, takes off their current clothing, tries on the desired garment, observes himself or herself in a mirror, takes off the desired garment, and then put their current clothing back on all in an attempt to view how that garment will appear on him or her. That can be tiresome, time consuming, or concerning to privacy to try on different garments at a physical location. For online clothing purchases, it is not possible to try on any particular garments.

It would be preferable to see how a garment appears on a consumer without having to physically try it on. Augmented reality offer possible solutions. It would be desirable to simulate a "likeness" or model of the consumer simulating him or her wearing a desired garment. However, augmented reality systems can still require substantial computing power, special cameras, and/or travel to a physical location. For example, an augmented dressing room system to Kjaerside et al in 2005 discloses a camera, a projection surface, and visual tags. For that system, the consumer must travel to and be physically present in order to interact with that system. A second augmented dressing room system to Hauswiesner et al in 2011 discloses using a plurality of depth cameras communicately coupled to a system which is used to display a model bearing likeness to the user with virtual clothes. Again, that second system requires a consumer to have specialized equipment, follow a complex process, and travel to a specific location.

For the above reasons, it would be advantageous for a system which enables a user to employ commonly available equipment to simulate himself or herself modeling selected garments.

SUMMARY

The present invention is directed to a system and method of simulating modeling a garment, comprising the steps of receiving a user image, a garment selection, and a user profile. A photo extraction module extracts the head and neck region from the user image. A colorization module extracts color frequency data from the user image for application to a base figure framework. The system selects and scales a base figure framework in response to user profile input. A stitching module joins said extracted head and neck region to the neck region of the selected base figure framework to output a base user model. A model display module overlays and scales the selected garment on the base user model. The model display module renders a near three dimensional user model, shading the user model based on colorization module data, whereby the system simulates the user wearing the selected garment.

These and other features, aspects, and advantages of the invention will become better understood with reference to the following description, and accompanying drawings.

DETAILED DESCRIPTION

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
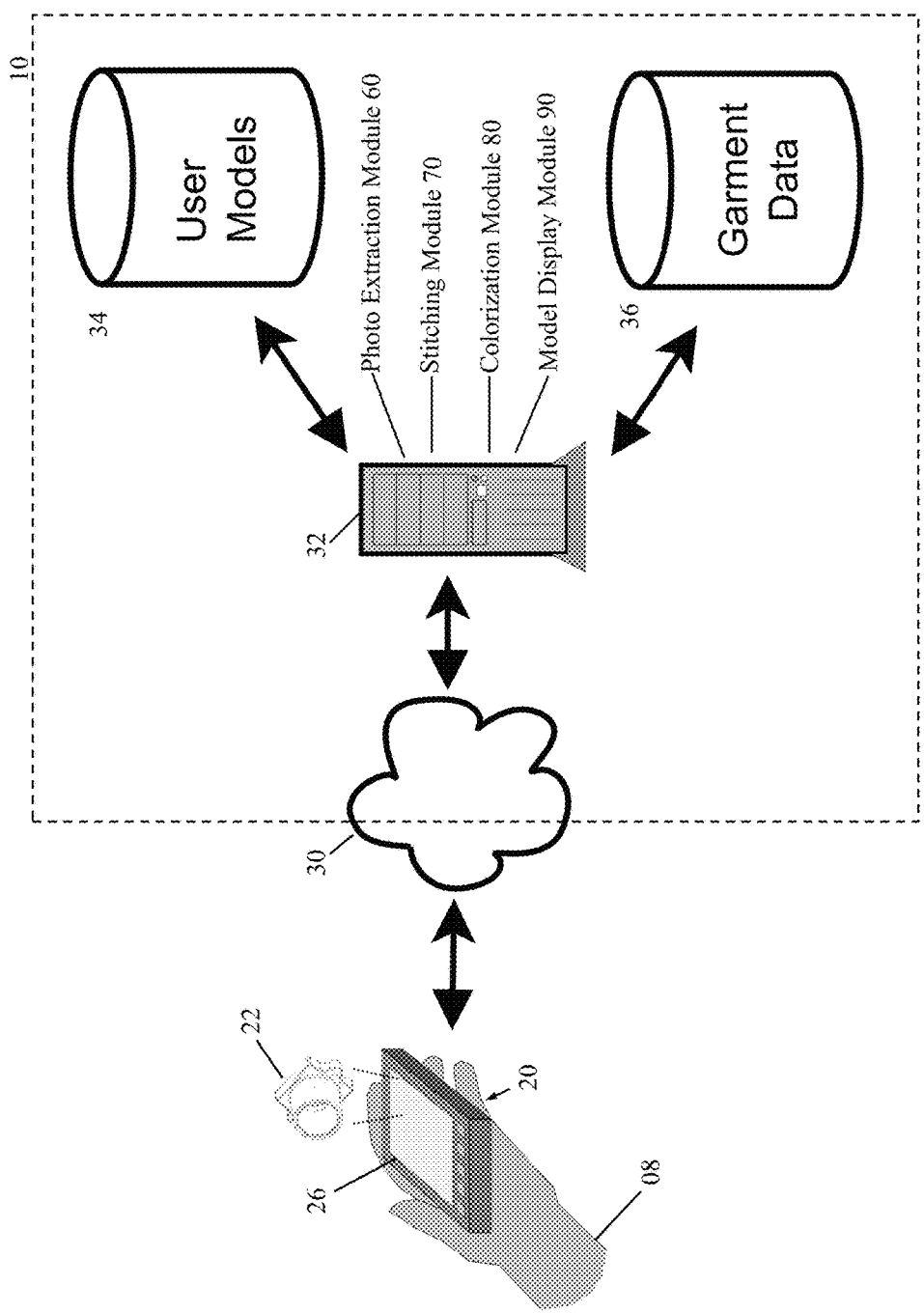
FIG. 1 depicts a block diagram of an embodiment of the current invention.

The present invention is directed to a system and process for approximated three dimensional (3D) simulation of a user modeling a garment on a selected background based on two dimensional images provided by the user. FIG. 1 depicts a block diagram of an embodiment of the system in operation. It depicts a handheld computer 20 with an integrated camera 22, a communication network 30, a server 32, a user model database 34, and a garment database 36. In exemplary use, the user 08 records an image with the camera 22 which is transmitted to the server 32 via the network 30. The server 32 processes the transmitted image and stores the processed image in the user model database 34. The server 32 augments the user provided image with a user selected garment from the garment database 36 and renders a simulated user model for display on the video screen 24 of the computer 20.

A computer 20 or server 32, as referred to in this specification, generally refers to a system which includes a central processing unit (CPU), memory, a screen, a network interface, and input/output (I/O) components connected by way of a data bus. The I/O components may include for example, a mouse, keyboard, buttons, or a touchscreen. The network interface enables data communications with the computer network 30. A server contains various server software programs and preferably contains application server software. The preferred computer 20 is a portable handheld computer, smartphone, or tablet computer, such as an iPhone, iPod Touch, iPad, Blackberry, or Android based device. The computer is preferably configured with a touch screen 26 and integrated camera 22 elements. Those skilled in the art will appreciate that the computer 20 or servers 32 can take a variety of configurations, including personal computers, hand-held devices, multi-processor systems, microprocessor-based electronics, network PCs, minicomputers, mainframe computers, and the like. Additionally, the computer 20 or servers 32 may be part of a distributed computer environment where tasks are performed by local and remote processing devices that are communicatively linked. Although shown as separate devices, one skilled in the art can understand that the structure of and functionality associated with the aforementioned elements can be optionally partially or completely incorporated within one or the other, such as within one or more processors.

Camera 22 is preferably a color digital camera integrated with the handheld computer 20. A suitable camera for input producing image input for the system includes a simple optical camera, that is to say a camera without associated range functionality, without depth functionality, without plural vantage point camera array, or the like.

The communication network 30 includes a computer network and a telephone system. The communication network 30 includes of a variety of network components and protocols known in the art which enable computers to communicate. The computer network 30 may be a local area network or wide area network such as the internet. The network 30 may include modem lines, high speed dedicated lines, packet switches, etc. The network protocols used may include those known in the art such as UDP, TCP, IP, IPX, or the like. Additional communication protocols may be used to facilitate communication over the computer network 30, such as the published HTTP protocol used on the world wide web or other application protocols.

Figure 6:
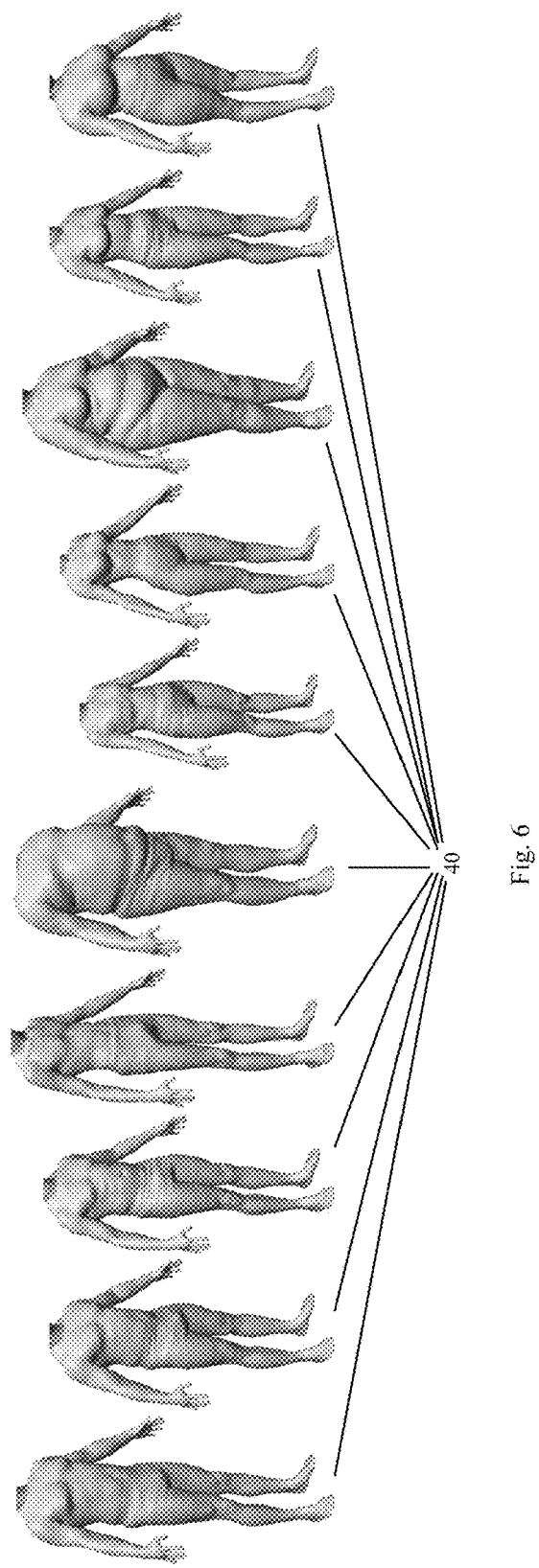
FIG. 6 depicts a plurality of different base figure frameworks.

Referring to FIG. 6, a plurality of base figure frameworks 40 are shown. The user model database 34 includes base figure frameworks 40 and stored user models 12, which are composites of user provided image extractions joined with one or more base figure frameworks 40, as will be disclosed further in the specification. The base figure frameworks 40 are a plurality of system created frameworks, each base figure framework 40 representing a major portion or all of the human body. In the exemplary embodiment, each base figure framework 40 represents the human body, including a portion of the neck and below. The base figures frameworks 40 are of varying relative body measurements and characteristics. That is to say the base figure frameworks 40 are generated with a relative height, weight, body type, chest measurement, band measurement, waist measurement, hip measurement, inseam, rise, thigh measurement, arm length, sleeve length, upper arm measurement, skin tone, eye color, hair color, hair length, and other characteristics. The user model database 34 also stores user information such as pant size, shirt size, or dress size. In one configuration, the user model database 34 includes sufficient base figure frameworks to form a dictionary of frameworks of differing body measurements and characteristics to represent cross-sections of the population. In one aspect, the base model figure frameworks 40 are stored with granular simulated relative measurements from the neck through the torso to the legs. A given measurement for a layer is paired with a given category or range of other characteristics. Thus, one figure framework 40 may represent, for example, a 42 inch chest measurement, a first given waist measurement or range, a first given hip measurement or range, and so on for the other characteristics. A figure framework dictionary is completed by varying the options for the figure frameworks while maintaining one static value for the isolated characteristic in order to represent sufficient cross-sections of the population. In an alternate configuration, the user model database 34 includes a single base figure framework 40 or a base figure framework 40 pair, one of male appearance and female appearance.

Figure 7:
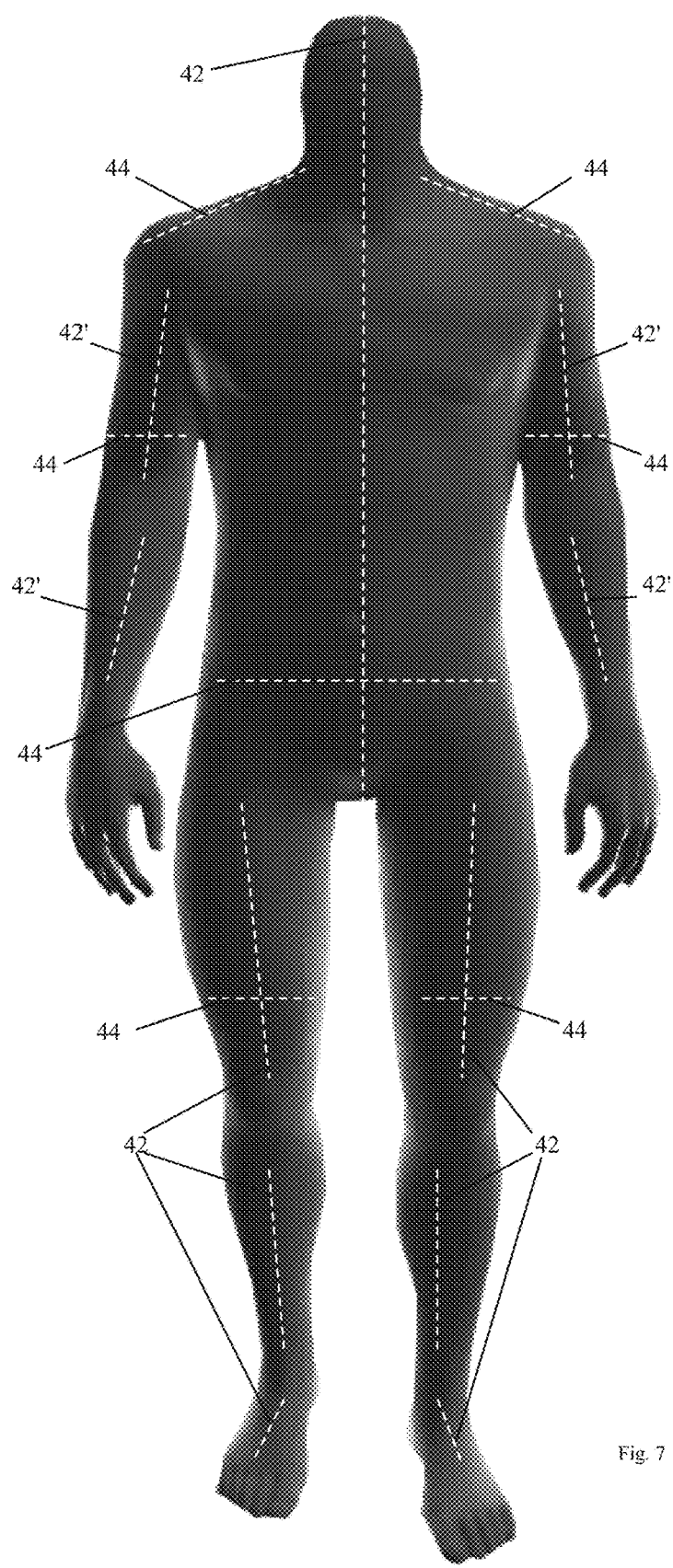
FIG. 7 depicts a base figure framework with reference region data.

Referring to FIG. 7, a single base figure framework 40 is shown. The base figure framework 40 present one or more axes 42 about which it may scaled. In one configuration, the base figure framework 40 presents a major axis 42 from which the base figure frameworks can be scaled. In a second configuration, the base figure framework 40 presents a plurality of axes 42', each associated with pivotable body parts.

For each base figure framework 40, a set of body reference locations 44 is stored. A body reference location 44 defines a particular location or set of locations within the base figure framework 40. It may be represented by a point, line, zone, boundary, body part name, or the like. The body reference regions 44 are preferably associated with one or more regions of the body or body parts. For example, the body reference regions 44 may represent the waistline region, knee region, or shoulder region.

Figure 8:
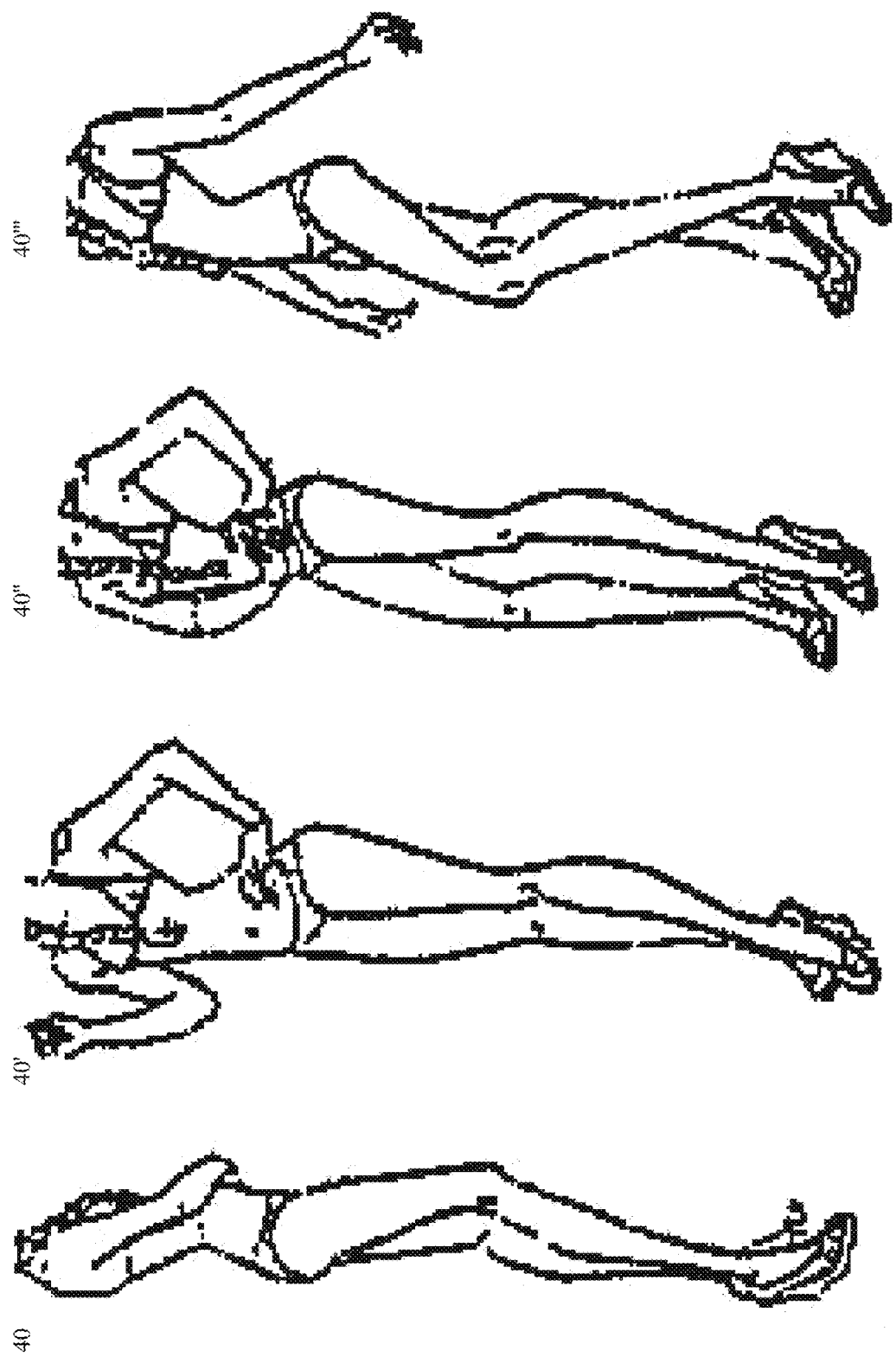
FIG. 8 depicts a series of a base figure framework.

Each base figure framework 40 includes two dimensional (2D) data. Each base figure framework 40 may include an associated set of image data for a given framework 40 for a particular set of body measurements and characteristics, with the associated image data representing the base figure framework in different "poses." FIG. 8 depicts a series of associated set of representative 2D figure frameworks 40 40' 40'' 40''' for a particular set of body measurements and characteristics. Please note they are partially clothed for appearance in this specification, unlike the frameworks 40 of the system. cloth Each of the images 40 40' 40'' 40''' shows the particular set of body measurements and characteristics from a different vantage point or in different positions, postures, or poses.

Figure 9:
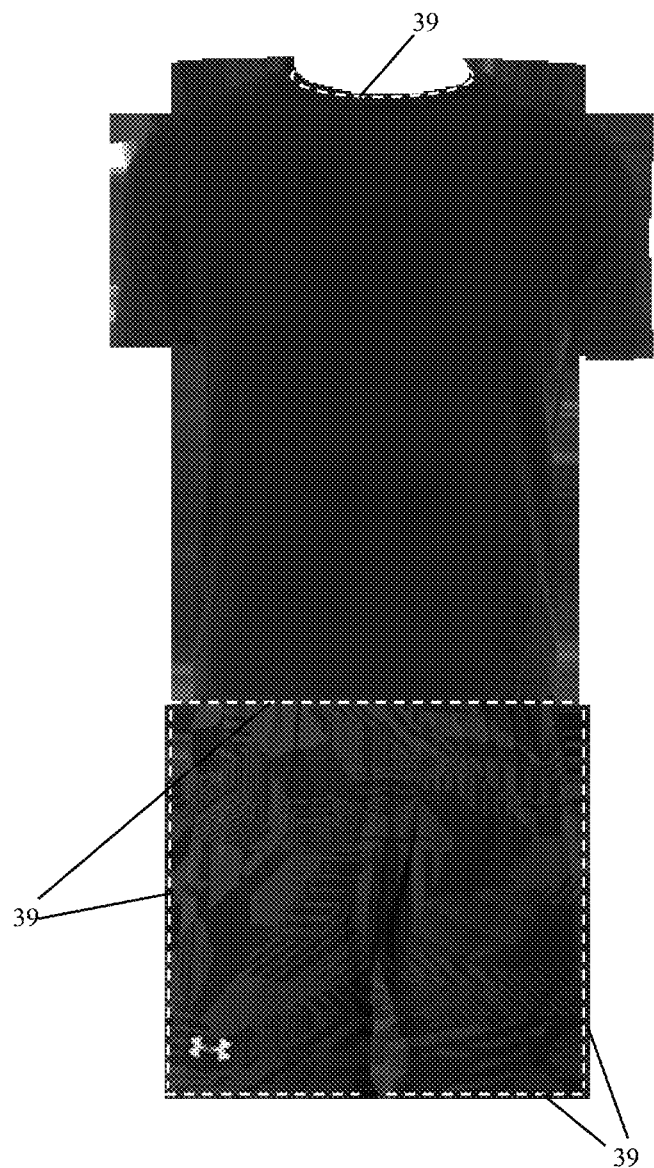
FIG. 9 depicts a garment with body reference data.

The garment database 36 includes data for a plurality of garments 38. FIG. 9 depicts a short and shirt garment 38 pair. The garment 38 data can include, but is not limited to, the garment type(s), color, pattern, size, images, and body reference region data 39. Each garment 38 entry represents a specific article of clothing that a user may virtually model. The garment 38 type is input. For example, a bra, a shirt, pants, dress, coat, or other article of clothing may be input. Additionally, at least one associated image, preferably taken from a frontal vantage point while the garment 38 is draped on a mannequin on a green screen background, is input into the garment 38 entry. Optionally, multiple images from different vantage points are input and associated with the garment 38.

Each garment 38 image includes body reference region data 39, facilitating system alignment and scaling of the garment 38 to the base figure framework 40. The body reference region data 39 indicates body regions of the base figure framework 40 with which the garment 38 should be paired. The body reference region data 39 may be represented by a point, line, zone, boundary, body part name, or the like. By way of example with a short and shirt garment 40 pair, the body reference region data 39 may include data for the knee region, waist region, and neck region. Likewise, the coordinates representing the lower edge of a shirt may be associated with the waist region.

Figure 17:
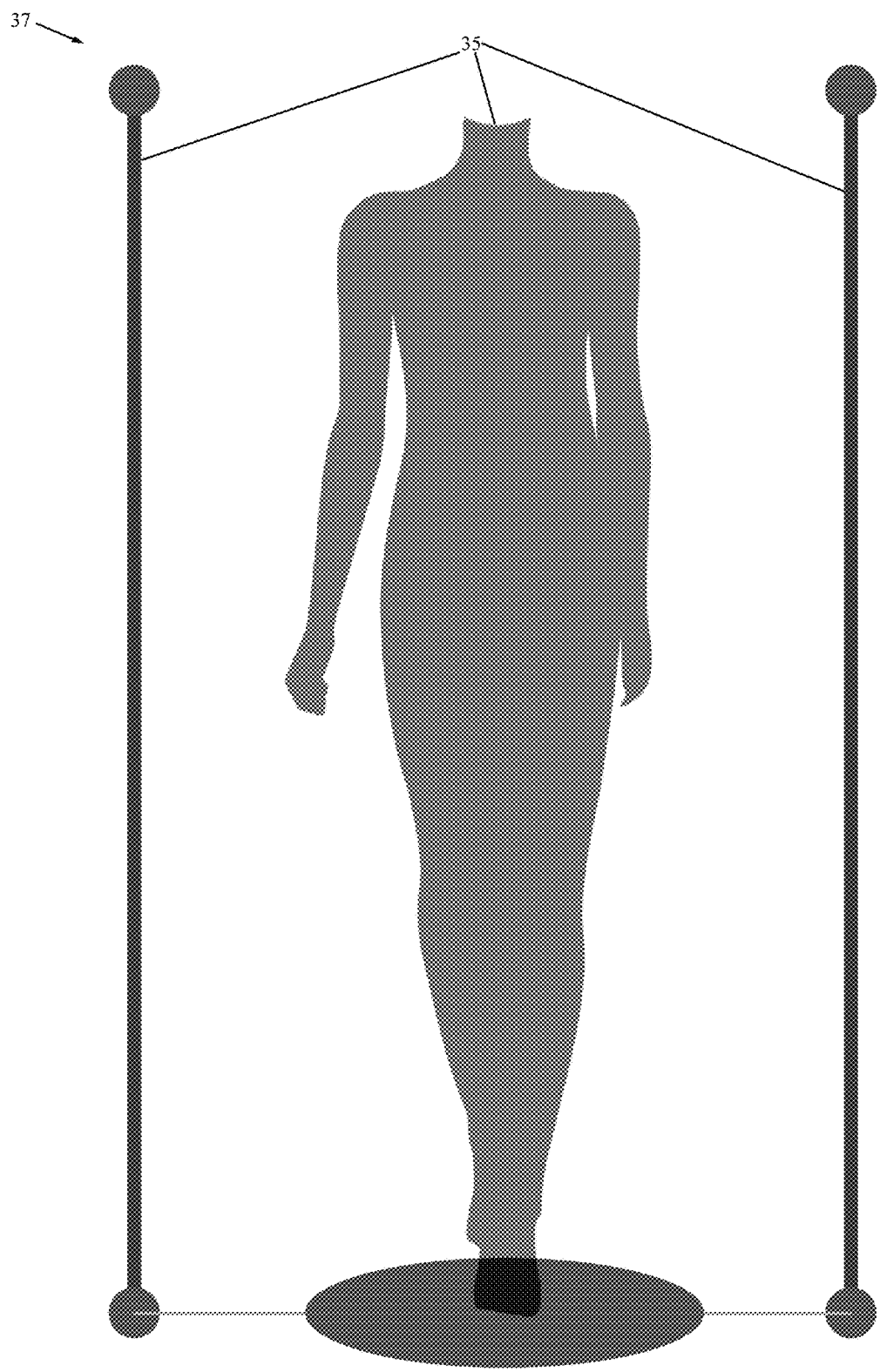
FIG. 17 depicts a lens overlay.

Optionally, the system incorporates further processes or apparatus to facilitate body region data 39 input. Referring to FIG. 17, lens overlay 37 is shown. The lens overlay 37 is a visual reference for pairing with a particular camera. It can be implemented internally in the camera 22 or manually paired with the lens. The lens overlay 37 includes visual highlights 35 to optimize the garment 38 position for ready calculation of body reference data 39. An exemplary visual highlight 35 set includes a pair of spaced apart parallel lines of the same length at the same offset with a silhouette matching a base figure framework disposed between the parallel lines. The silhouette height matches the length of the parallel lines. In use, the garment 38 is placed in the camera 22 field of view and the position of the camera 22 or zoom is adjusted such that the garment 38 covers the selected region of the silhouette, and, in turn, the base figure framework 40.

Figure 18A:
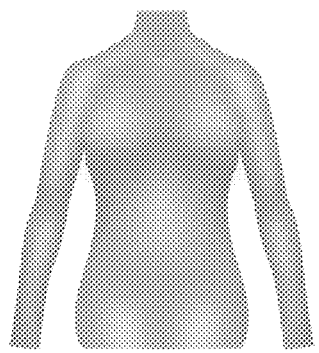
FIGS. 18a-18c depict a series of garment data layers.
Figure 18B:
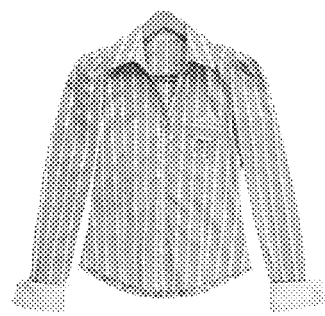
Figure 18C:
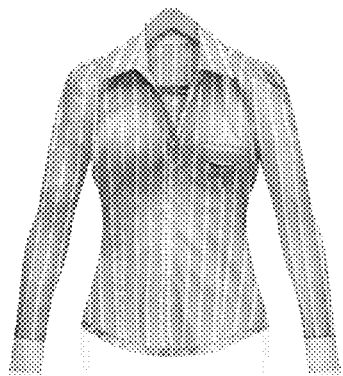

In addition to direct image data, the garment database 36 optionally includes overlay layers for the garment 38 image data for passing to model display module 90 (disclosed below) in order to improve garment 38 display. One such overlayer layer includes normal map, texture map, bump map, parallax map, displacement map, or other similar map data of the garment 38 for passing to the model display module 90. FIG. 18*a* shows a bump map layer of a garment 38 and FIG. 18*b* shows a flat image layer of the garment 38. FIG. 18*c* shows the final garment 38 as it may be rendered by the model display module.

The system 10 includes a photo extraction module 60 configured to receive a user photograph having the user as well as a background as input and generating an output image having an appearance of a precisely extracted section of the photograph. In the exemplary configuration, the input is a user photograph including the face, and the output is an extracted head and neck portion (with a surrounding blended region 64).

Figure 10:
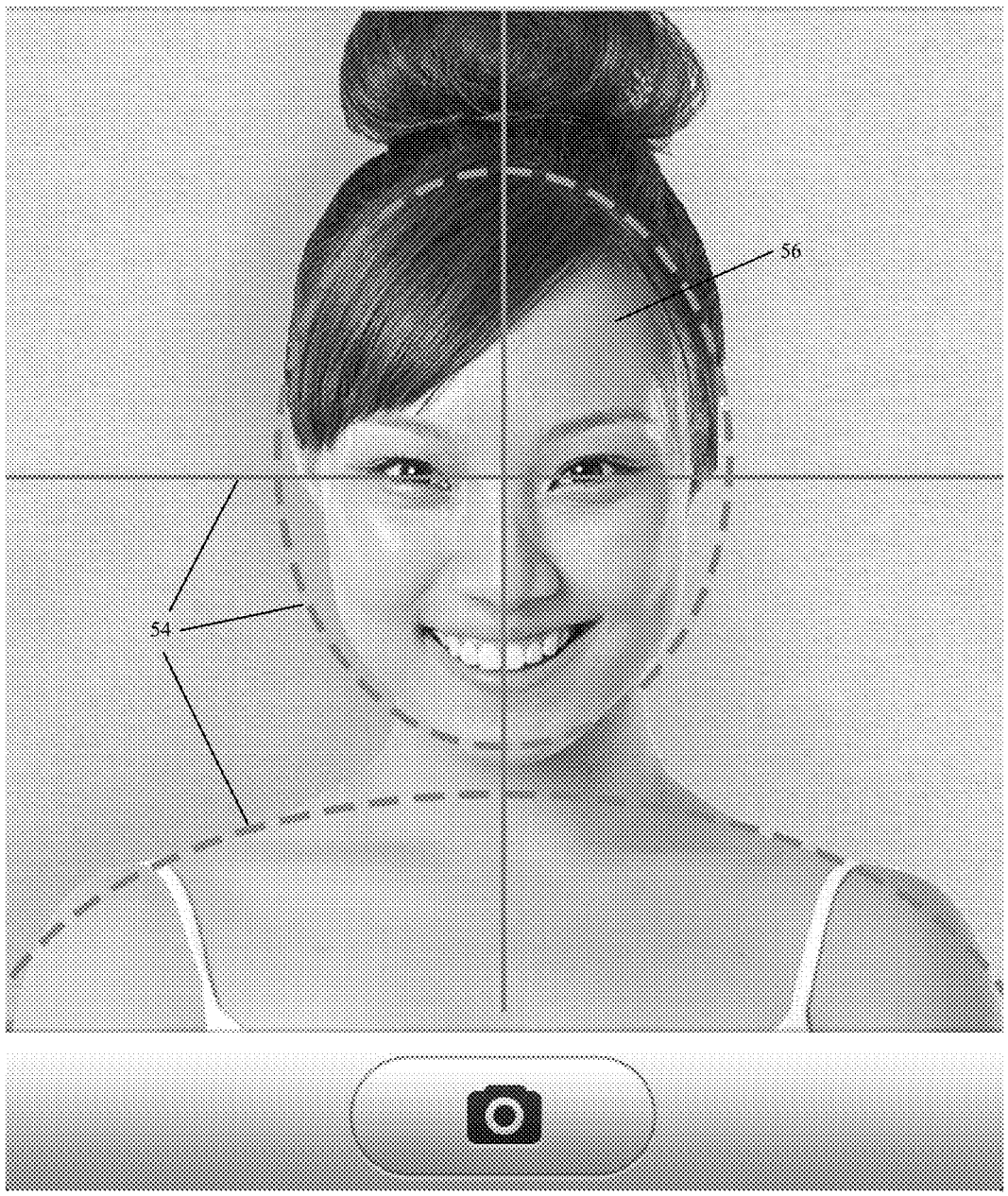
FIG. 10 depicts a photo extraction module interface.
Figure 11:
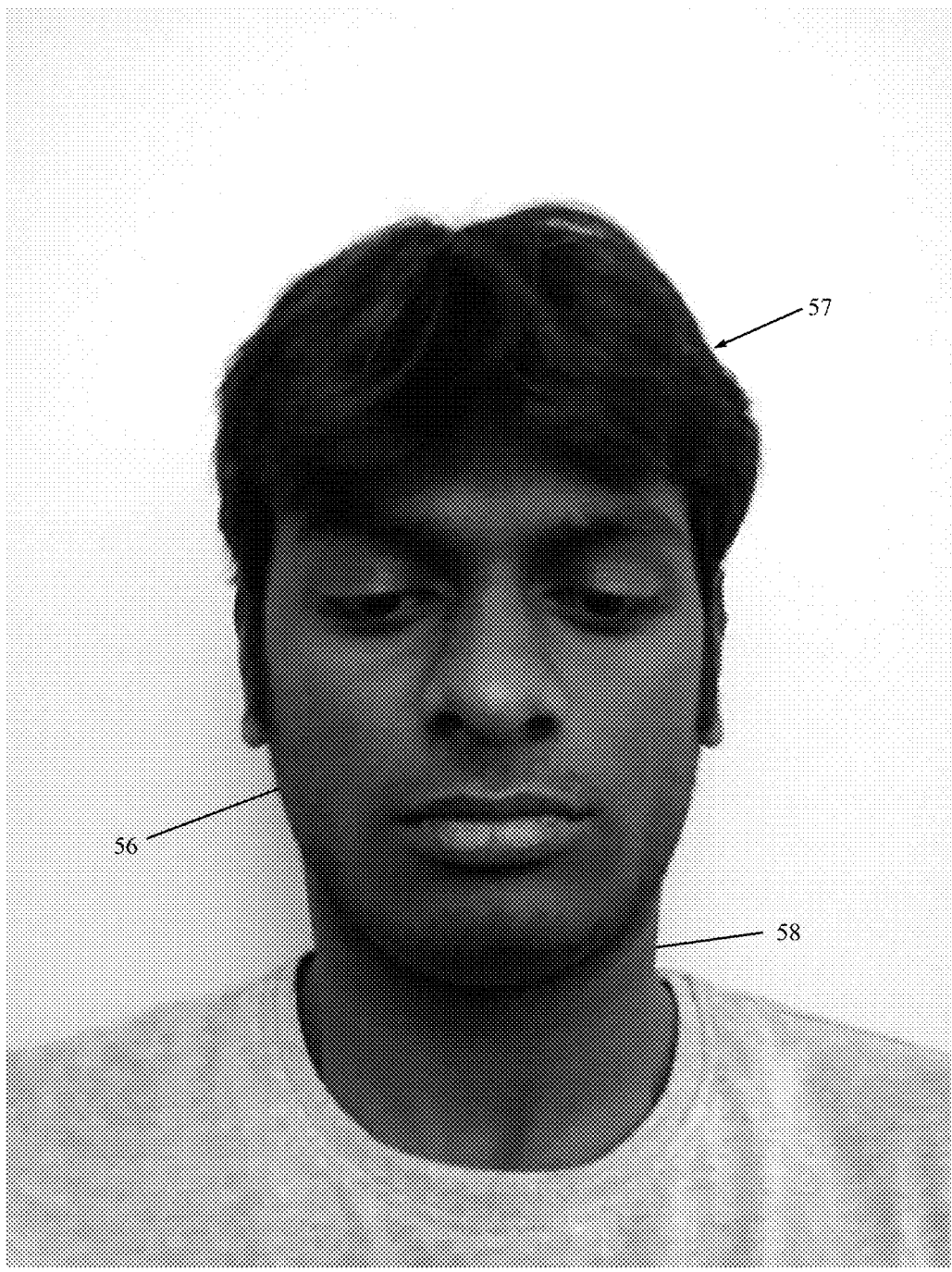
FIG. 11 depicts a representative user photo.

In one configuration, shown in FIG. 10, the photo extraction module 60 provides an interface to the user in order to facilitate extraction of the facial region 56 from the user provided image. The photo extraction module 60 provides at least one guide 54 overlaying the image. The guides 54 are shaped to enable coarse indication of the facial region 56 to the system. Suitable guide shapes for encompassing a portion of the facial region 56 include ellipses, quadrilaterals, or other polygons. Other suitable guide shapes permit the user to signal specific points within the facial region 56 to the system. Such a representative shape includes a cross-hair guide 53. A state of this configuration for the interface is shown in FIG. 10. A first elliptical guide 54 is presented to the user for coarse signaling of the outer boundary of the facial region 56. A cross-hair guide 53 is presented to the user for coarse signaling of the center of the facial region 56. A second elliptical guide 55 signals image area outside the facial region 56. In this configuration, the photo extraction module 60 extracts the facial region 56 of the image, removing the background using systems and processes known in the art. Representative systems and processes include U.S. Pat. No. 6,611,613 to Kang et al., U.S. Pat. No. 7,123,754 to Matsuo et al., U.S. Pat. No. 6,885,760 to Yamada et al, which are incorporated by reference.

In exemplary configuration, the photo extraction module 60 employs transparency based blending of a region between the extracted head 57 and neck 58 portion and the background 14 against which the user model 12 will be displayed. In a further exemplary configuration, the photo extraction module 60 employs a mean value coordinate matting based approach for the blending. Additional disclosure on the general mean value coordinate matting approach is in "Coordinates for Instant Image Cloning" by Farbman et al, which is annexed and incorporated by reference.

Figure 12:
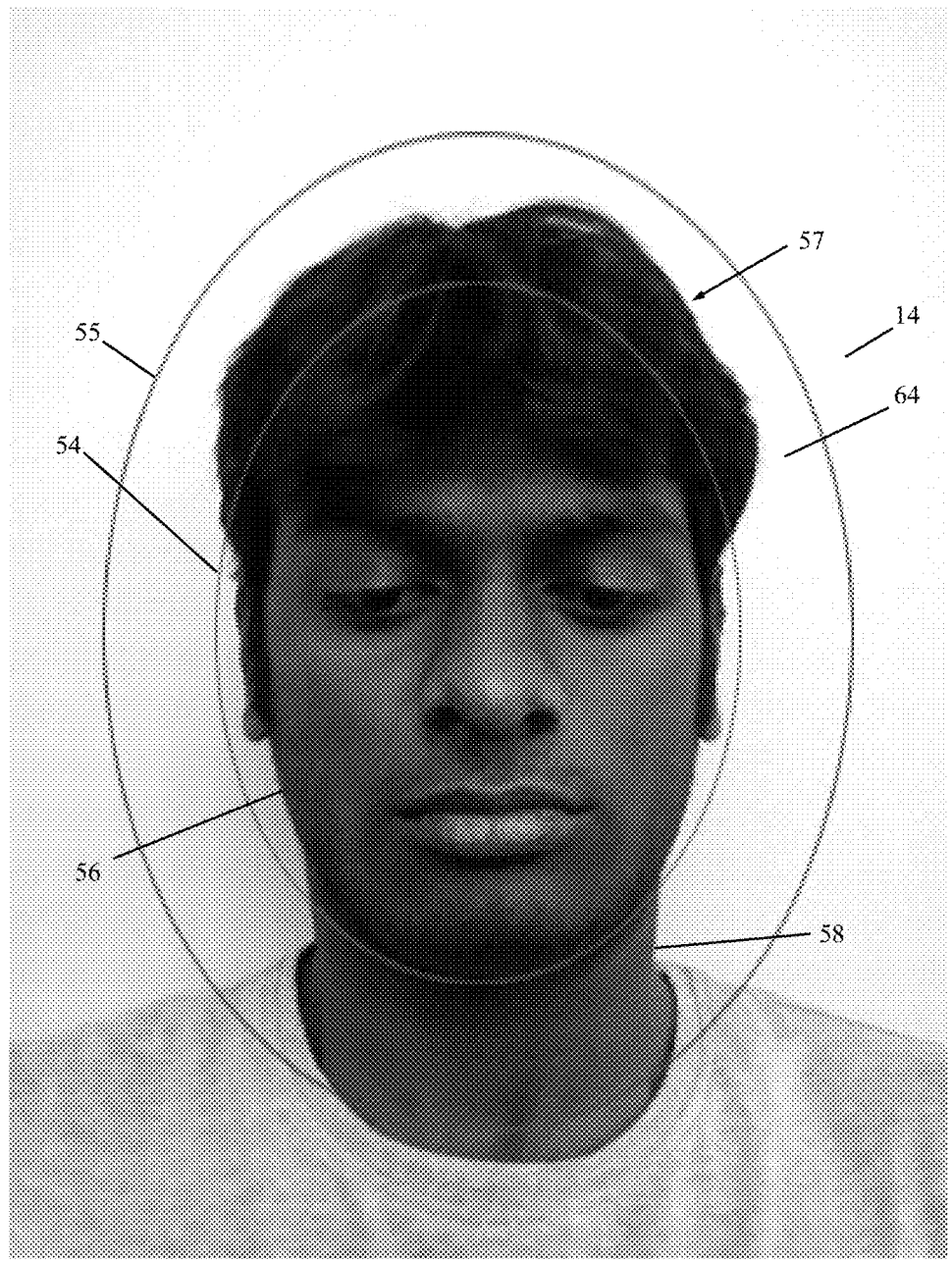
FIG. 12 depicts an alternate photo extraction module interface.

Referring to FIG. 12, this alternate configuration of the photo extraction module 60 is shown. The photo extraction module 60 presents two guides 54 55, preferably of the same shape and as simple polygons, such as are ellipses or quadrilaterals. A first guide 54 is nested inside a second guide 55 and presented to the user for coarse placement inside the facial region 56. The user is directed to place the first guide 54 around the facial region 56. Upon placement, the interior of the first guide 54 includes substantially the facial region 56. The outer guide 55 preferably has the same center as first guide 55 and is presented to the user for coarse placement outside the neck, head, and hair region 57. The guides 54 55 comprise triangular meshes. After user placement of the guides 54 55, a facial region 56, a blended region 64, and the model background region 14 are presented. Further, based on the user placement, the photo extraction module 60 defines the ellipses center position, an inner and outer region for each of the ellipses 54 55, and a boundary region.

The photo extraction module 60 calculates the mean value coordinates of the points within the inner and outer elliptical regions with respect to the boundary of the region. These mean value coordinates of the elliptical region are used to interpolate the boundary region colors. These interpolated color values are later used in creation of transparency values to apply, effectively to the blended region 64. These steps will be considered in more detail below with representative pseudo-code. It should be appreciated that these are non-limiting, representative examples.

The photo extraction module 60 calculates the mean value coordinates of the points within the inner and outer elliptical regions with respect to the boundary of the region. The following elliptical boundary interpolation process is executed for each the inner ellipse 54 and outer ellipse 55:
  boundaryCoords: list of boundary coordinates
weights: matrix of weights for each boundary point in boundaryCoords
  FOR EACH point INSIDE elliptical region
    myweights:=get list of mean value weights for given point
    color:=get the list of colors of all points in boundaryCoords in the image
    interpolated_color:=SUM of myweights*color of each boundary point
  END FOR
  The output of elliptical boundary interpolation process is an array of interpolated colors in elliptical shape within a rectangular image. Next an extrapolation process is executed in order to receive the interpolated colors toward the boundary of the face image.
FOR EACH point OUTSIDE elliptical region
  newPoint:=shift the origin of the image dimensions from left bottom corner to the center of image
  normPoint:=normalize the point to range [1,1] using dimensions of the image
  invertPoint:=Point(1/normPoint.x, 1/normPoint.y)

color:=fetch color from this point within the ellipse, invertPoint
  Assign the color of point outside ellipse to this color.
END FOR
FOR ANY point INSIDE elliptical region
  Retain the value of the color interpolation.
END FOR
The output of the extrapolation process is two rectangular images with different boundary color interpolations. A transparency map is produced for overlay of the two images.
  FOR EACH pixel IN image
  mycolor:=color of the current pixel in face image
  inner:=fetch color interpolation value from image with inner ellipse extrapolation
  outer:=fetch color interpolation value from image with outer ellipse extrapolation
  point:=shift pixel coordinates to frame with center of image as center
  ENCODE transparency as 0 if point outside outer ellipse
  ENCODE transparency as 1 if point inside inner ellipse
  ENCODE transparency as follows if otherwise.
  T:=normalized distance (values from [0,1]) of point from center of ellipses
  # T essentially indicates point location with respect to both the ellipses
  # T is <0 for points inside inner ellipse and >1 for points outside outer ellipse
  # Colors are assigned values in red, green, and blue channels and the below operation is executed channel-wise
  numerator:=mycolor-inner
  denominator:=outer-inner;
  NumeratorSum:=Sum Of Each Channel (as absolute value of channel) raised to power of 1.124
  DenominatorSum:=Sum Of Each Channel (as absolute value of channel) raised to power of 1.124
  transparency:=NumeratorSum/DenominatorSum
  transparency:=transparency raised to power of 0.8896797
  CLAMP transparency to [0,1] range
  t:=3*T*T−2*T*T*T
  MODULATE transparency with t
  ENCODE this modulated value as transparency of the current pixel
END FOR This module 60 or other modules 80 may further incorporate active system modeling to refine extraction based on user guide 54 55 placement or locate facial features or regions. Further disclosure is provided in "Locating Facial Features with an Extended Active Shape Model" to Milboorw et al, which is annexed and incorporated by reference.

The photo extraction module 60 applies the transparency maps and stores the transformed image data in the user model database 34 for further processing by the system 10.

The system 10 includes a colorization module 80 configured to select and apply color to a candidate base figure framework 40 to which the extracted head and neck region 57 from the photo extraction module 60 will be joined, simulating similar skin tone to that of the user. The colorization module 80 selects a skin tone identifier for application based on color sampling from the facial region 56 of the user provided image. In the exemplary configuration, the skin tone identifier includes four components: a primary diffuse color, a secondary diffuse color, a shadow color, a highlight color. The colorization module 80 selects an area or areas to sample that is likely to best represent the skin tone given skin tone variation throughout the face, flash photography, color loss or change in digital compression of the user provided image, deviations from perfect frontal vantage points, and other similar factors. Preferably, the colorization module 80 samples a circular area around the chin. The colorization module 80 builds a table based on the sample area and the color distribution therein, where the four components are calculated based on the relative frequency of colors in the sample. In this configuration, the colorization module 80 selects the most frequent color as the diffuse color, the most frequent dark color as the shadow color, the most frequent bright color as the highlight color, and the color with the greatest difference in hue from the primary diffuse color as the secondary diffuse color. The colorization module 80 stores the color components for use by the model display module 90.

Figure 13A:
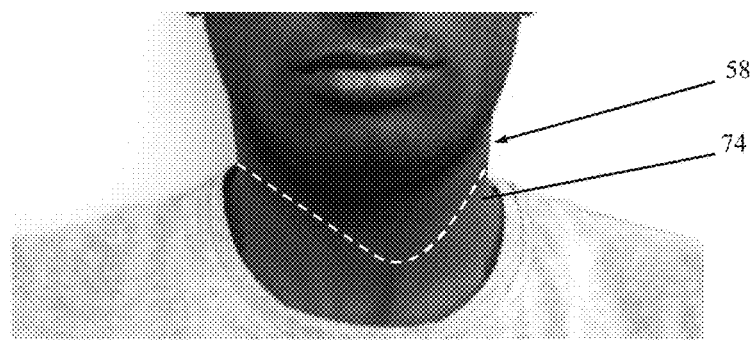
FIGS. 13a and 13b depict representative input into the stitching module.
Figure 13B:
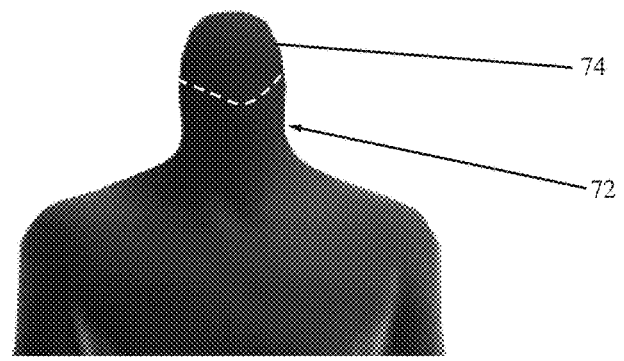

Referring to FIGS. 13a and 13b, the system 10 further includes a stitching module 70 configured to join the extracted head and neck region 57 from the photo extraction module 60 with the base figure framework 40 from the colorization module 80. The stitching module 70 first scales the width of the neck 58 from the user provided image to equal the width of the neck 72 of the base figure framework 40, scaling the remaining head and framework accordingly. In a first configuration, the edge of the neck 58 from the photo extraction module 60 is joined to the edge of the neck 72 of the base figure framework 40.

In another configuration, the neck 58 from the photo extraction module 60 is joined to the edge of the neck 72 of the base figure framework 40 similarly to the process of blending in the photo extraction module 60. The stitching module 70 defines a user neck 58 region with its edge being treating similarly to the above outer elliptical region, except this module 70 defines a substantially linear or curvilinear mesh as a first boundary. The stitching module 70 defines a framework neck 72 region with its edge being treating similarly to the inner elliptical region, except this module 70 defines a substantially linear or curvilinear mesh as a second boundary. The module 70 defines a blended neck region 74 disposed between the framework neck 72 region and the user neck 58 region. The transparency map is generated for overlay of the two regions as disclosed above. The stitching module joins the extracted user neck 58 region to the blended neck region 74 with the framework neck region 72, resulting in a base user model 11.

Figure 14:
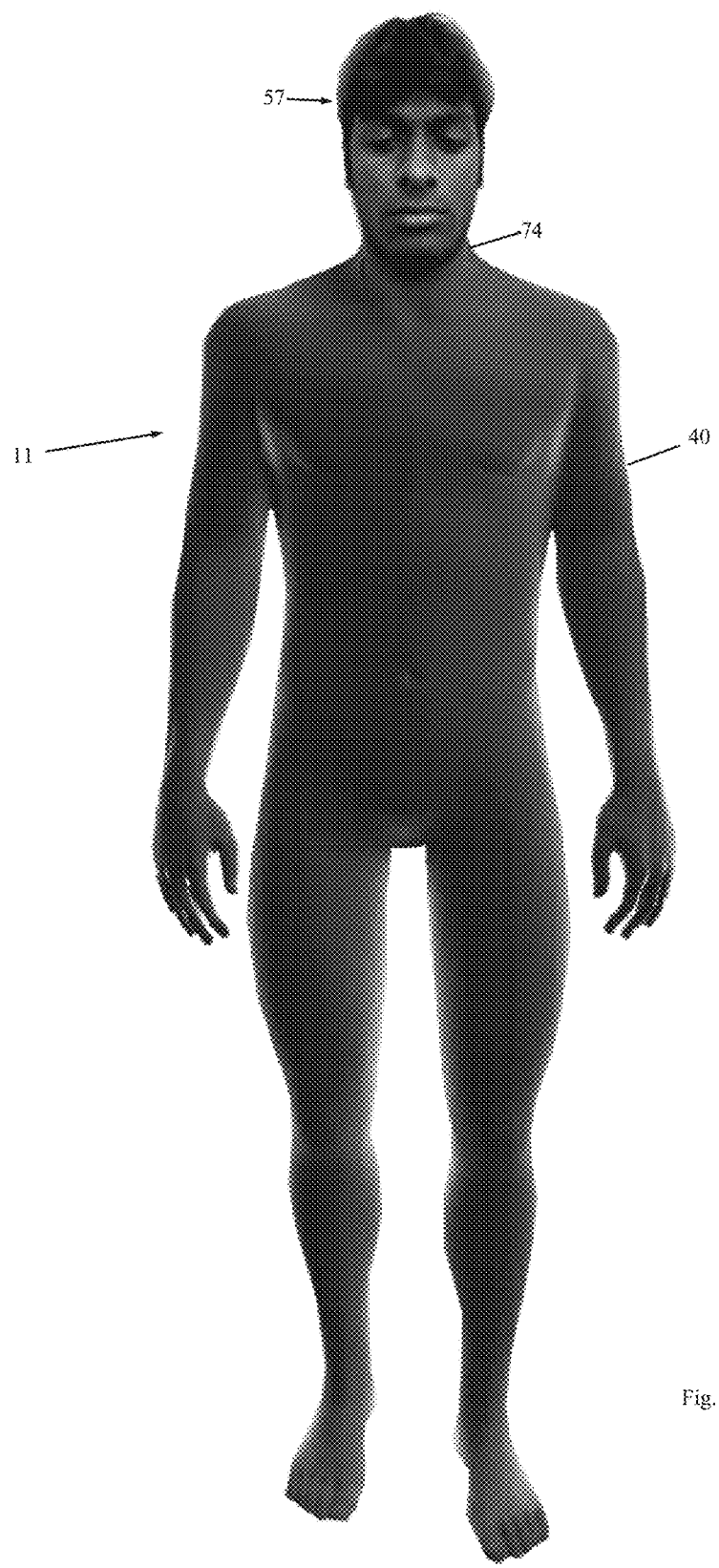
FIG. 14 depicts a base user model.

In yet another configuration of the stitching module 70, the chin from the photo extraction module 60 is joined to the edge of the neck 72 of the base figure framework 40 similarly to the process of blending in the photo extraction module 60. The stitching module 70 defines a user chin region with its edge being treating similarly to the above outer elliptical region, except this module 70 defines a mesh outlining the chin as a first boundary. The stitching module 70 defines a framework neck 72 region with its edge being treating similarly to the inner elliptical region, except this module 70 defines a substantially linear or curvilinear mesh as a second boundary. The module 70 defines a blended neck region 74 disposed between the framework neck 72 region and the user chin region. The transparency map is generated for overlay of the two regions as disclosed above. The stitching module joins the extracted user chin region to the blended neck region 74 with the framework neck region 72, resulting in a base user model 11. FIG. 14 illustrates a representative base user model 11.

Figure 15:
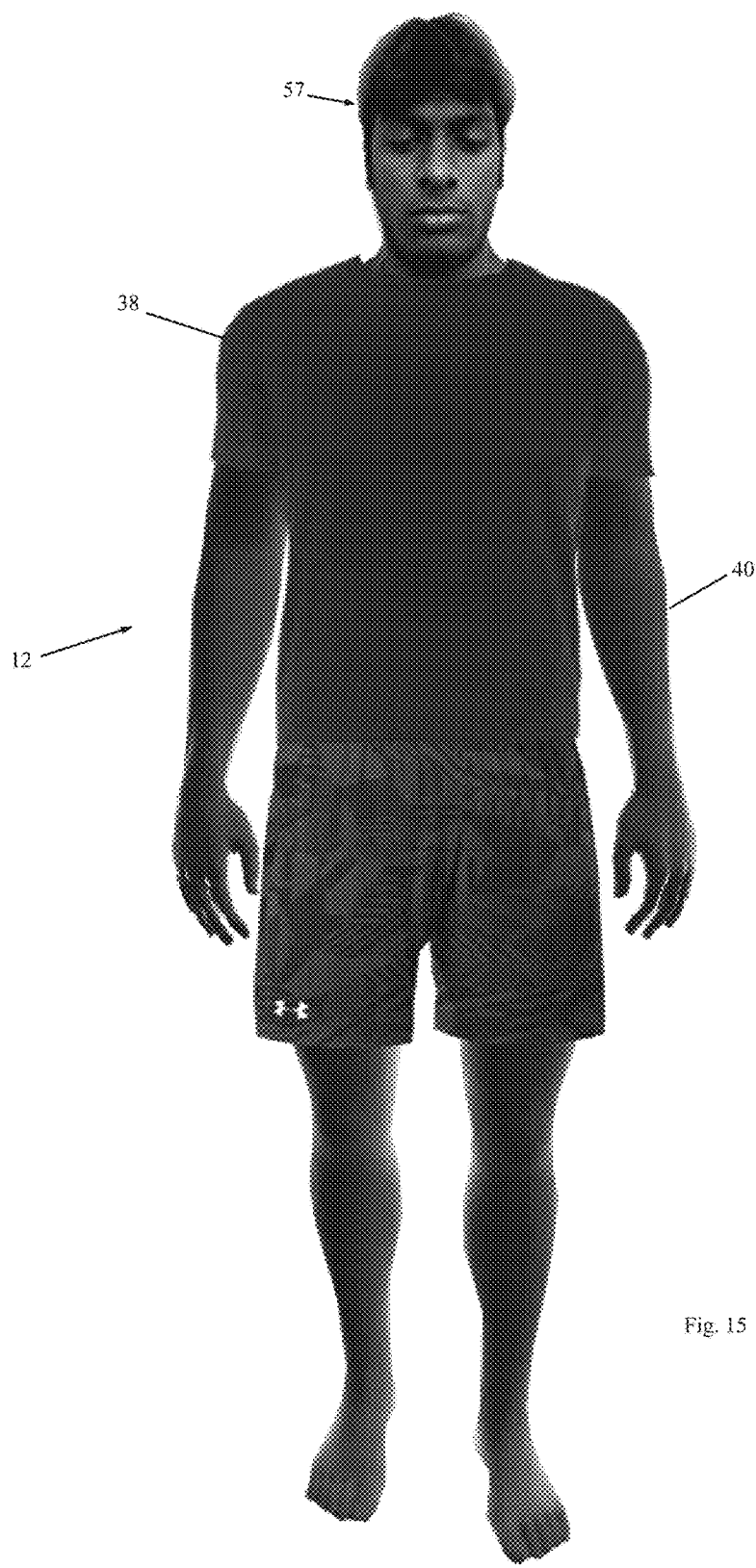
FIG. 15 depicts a user model.
Figure 19:
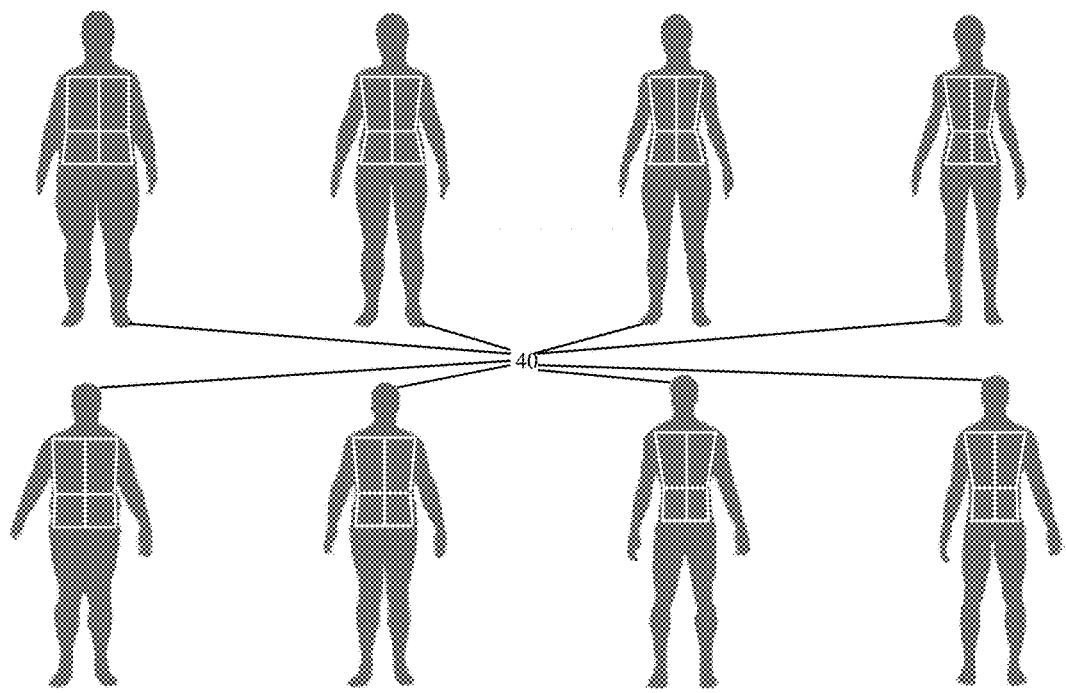
FIG. 19 depicts garment transforms base figure frameworks.

Referring to FIG. 15, the system 10 includes a model display module 90 configured to apply garments 38 to the base user model 11, apply color to the base user model 11 and display the user model 12. A garment 38 for modeling is received by the model display module 90. The module 90 retrieves image data for the garment 38 and the body reference region data 39 for the garment. It also retrieves the reference regions 44 for the framework 40 of the base user model 11. The module 90 maps the body reference regions 39 to the corresponding reference regions, associating the regions of the selected garment to regions of the user model. The garment 38 is scaled and overlaid on the base user model 11 according to the associated regions, correlating associated garment 40 regions to the framework 40 regions. The module 90 may employ warp transformation, affine transformation, or similar transforms. FIG. 19 shows alternate transformations applied varying differing base figure frameworks 40.

Referring back to FIG. 15, the model display module 90 is configured to display a near 3D user model 12. The model display module 90 employs normal mapping and related rendering techniques for display of the user model 12. The process of per-pixel lighting in a three-dimensional model uses the surface normal and the light vector at each pixel to calculate the brightness of the pixel. A surface normal is like an arrow that points in the direction that the surface of the model is facing. A light vector is a line from the point on the surface to the position of the light. As the angle between the surface normal and the light vector gets greater, the color of the pixel gets darker (and vice versa). Texture mapping is the process of applying a texture, rendering wherein the texture gets mapped onto the surface. The surface normal at each pixel is used along with the color values in the texture map to determine the lighting for each pixel. A normal map is similar to a texture map but includes surface normal data instead of color values. More specifically, a normal map includes data that alters the original surface normals of the model. It is within the spirit of this invention to employ normal mapping, texture mapping, bump mapping, parallax mapping, displacement mapping, or other similar approaches.

In the exemplary embodiment, the model display module 90 employs a normal mapping based approach, where only two components are used for shading. For each pixel, the color of the pixel is retrieved, corresponding to the normal vector if the 3D point was projected into the position of that pixel. Using that normal vector, a set of cosine values is computed using dot products with preset vector units, with the preset unit vector corresponding to a virtual light position. The values are normalized to a range and used as weights to mix the four color from the colonization module 80. These steps will be considered in more detail below with representative pseudo-code. It should be appreciated that this is nonlimiting, representative example.

```
uniform sampler2D background;
uniform sampler2D face;
uniform sampler2D normalmap;
uniform sampler2D garment;
uniform int windowWidth;
uniform int windowHeight;
uniform int width;
uniform int height;
uniform float bodyScale;
uniform vec4 diffuse_color_0;
uniform vec4 diffuse_color_1;
uniform vec4 diffuse_color_2;
uniform vec4 specular_color;
vec2 imgCoords;
vec2 scaledCoords;
vec3 light = vec3(0.5,0.5,0.0);
vec3 light_dir = vec3(1.0,2.0,1.0);
```

-continued

```
float diffuse_power = 1.25;
float SM_Quality = 0.2;
float amb_strength = 0.4;
float Cartoon_sha=0.3;
float filter_size = 1.53;
in vec2 ex_Tex;
out vec4 out_Color;
vec4 skinColoring(vec4 normal_color)
   {
   vec4 diffuse_color;
      vec4 ret_val;
      //vec2 normal = vec2(normal_color.r, normal_color.g);
      vec2 normal = vec2(2*normal_colors-1, 2*normal_color.g-1);
      vec2 normal1 = normal_color.b*normal;
      vec2 normal2 = vec2(2*normal_colors-1, 2*normal_color.g-1);
      // These are four linearly independent 2D lights that can illuminate
the whole
body. . .
      vec2 light0 = normalize(vec2( 1.0, 1.0));
      vec2 light1 = normalize(vec2(-1.0, -1.0));
      vec2 light2 = normalize(vec2(-1.0, 1.0));
      vec2 light3 = normalize(vec2( 1.0, -0.0));
      //These are parameters between 0-1, which provide contribution
of each light
      float t = 0.5*dot(normal, light0)+0.5;
      float u = 0.5*dot(normal, light1)+0.5;
      float s = 0.5*dot(normal1, light0)+0.5; if(s<0) s=0; if (s>1) s=1; s =
pow(s,10.0);
      float s2 = length(normal2); if(s2<0.0) s2=0; if (s2>1.0) s2=1.0; s2 =
pow(s2,10.0);
      t=(t-amb_strength)/Cartoon_sha; if(t<0) t=0; if (t>1) t=1;
      // This one sets up colors of the shadow regions.
      diffuse_color = 0.5*(diffuse_color_1+vec4(0.0));
      // This is quadric Bezier term that provide a smooth diffuse
shading for light0
      diffuse_color = u * u * diffuse_color_1 +2* u* (1.0 - u) *
0.75*diffuse_color_2 + (1.0 - u) * (1.0 - u) * diffuse_color;
      // This is linear Bezier term that also provide a smooth
diffuse shading for
light1
      diffuse_color = t * diffuse-color_0 +(1.0- t) * diffuse_color;
      // This is 2D specular reflection term
      diffuse_color =s * (0.2*specular_color+0.8*vec4(1.0)) + (1.0 - s) *
diffuse_color;
      // This one provides subsurface scattering effect without
subsurface scattering
      diffuse_color = s2 * texture2D(background,vec2(.5,.5)) + (1.0 - s2) *
diffuse_color;
      ret_val = diffuse_color;
      return ret_val;
   }
void main( )
{
   vec4 bgrnd = texture2D(background,ex_Tex);
   float scaleFactor = 0.505;
   float w = float(width)*scaleFactor;
   float h = float(height)*scaleFactor;
   vec2 headCorner = vec2(w/2,h/2);
   vec2 windowCenter;
   imgCoords = gl_FragCoord.st;
   vec2 normImgCoords= vec2(imgCoords.s/windowWidth,1-
imgCoords.t/windowHeight);
   scaledCoords = vec2( (normImgCoords.s+(bodyScale-1)/2.0)/bodyScale,
normImgCoords.t);
   vec4 dress = texture2D(garment,scaledCoords).bgra;
   vec4 normal = texture2D(normalmap,scaledCoords).bgra;
   vec4 skin = skinColoring(normal);
   vec2 trans1 = imgCoords - windowCenter + headCorner;
   vec4 skin_bgrnd = mix(bgrnd,skin,normal.a);
   vec4 head_skin_bgrnd;
   if( trans1.x>0 && trans1.x<w && trans1.y>0 && trans1.y<h )
   {
      vec2 crds = vec2(trans1.x/w,1.0-trans1.y/h);
      vec4 head = texture2D(face,crds);
      head_skin_bgrnd = mix(skin_bgrnd,head,head.a);
   }
```

```
    else
    {
        head_skin_bgrnd = skin_bgrnd;
    }
    out_Color = mix(head_skin_bgrnd,dress,dress.a);
}
```

Figure 2:
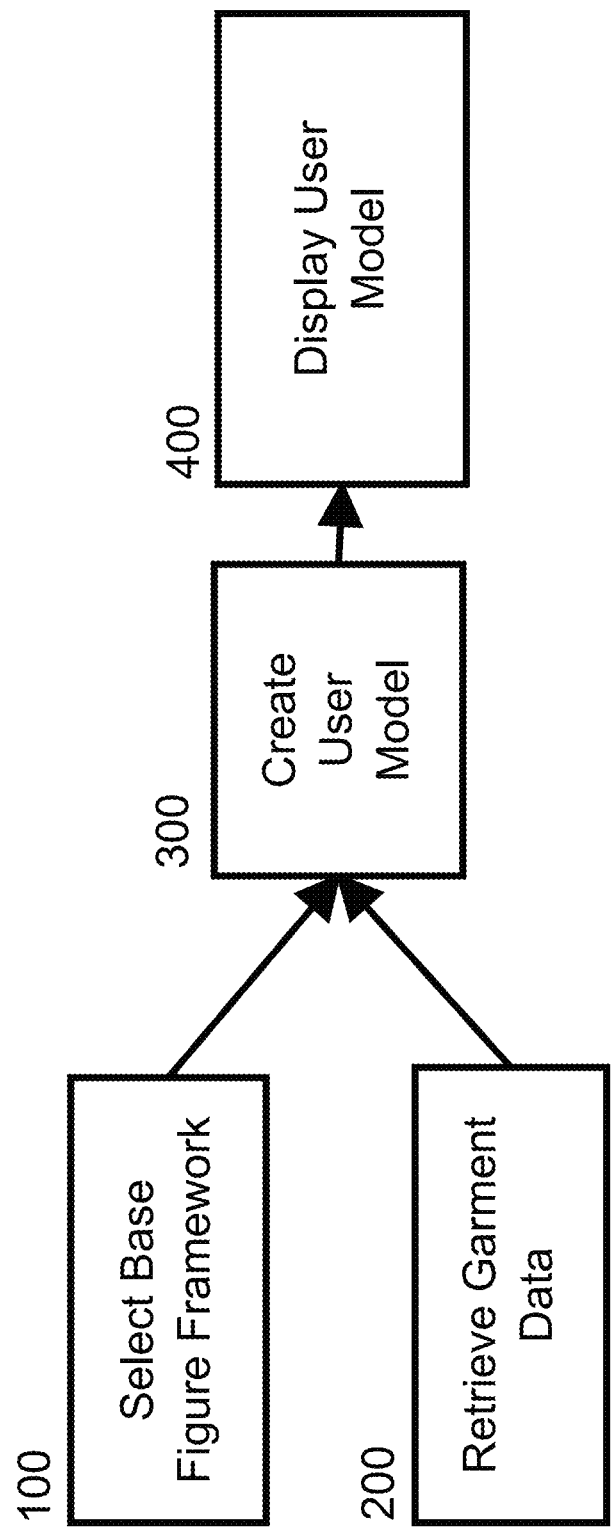
FIG. 2 depicts a flowchart for a process implemented to the system of FIG. 1.

FIG. 2 shows an embodiment of the process implemented to the system of FIG. 1. The base figure framework is selected 100. Using retrieved garment data 200, the system generates a user model 300, which is displayed to the user 400. These steps will be considered in additional detail below.

Figure 4:
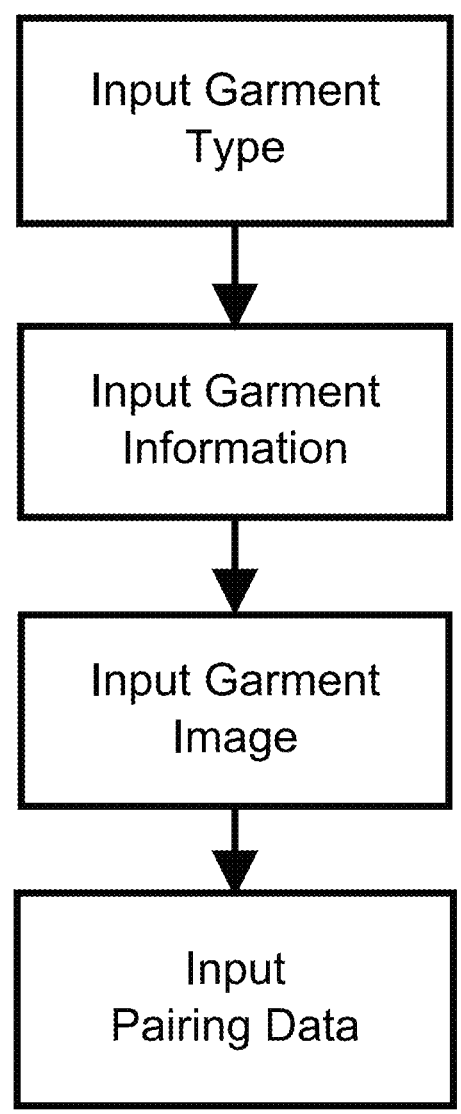
FIG. 4 depicts a flowchart for the process of garment database input.

Referring to FIG. 4, garment 38 data is input into the garment database 200. At step 205, the garment 38 type is input. Auxiliary associated garment 38 data, such as a product identifier, size, color, barcodes, or other data is input 210. Next, one or more images of the garment 38 from a camera 22 are input 215. Suitable images includes those captured from a simple optical camera. The preferred vantage point of the garment 38 images is from the front of the garment with the garment draped on a manikin, with optional supplemental images from the sides and rear of the garment 38. The garment's 38 information is stored in the garment database 36. The product identifier is optionally associated with a bar code.

Figure 3:
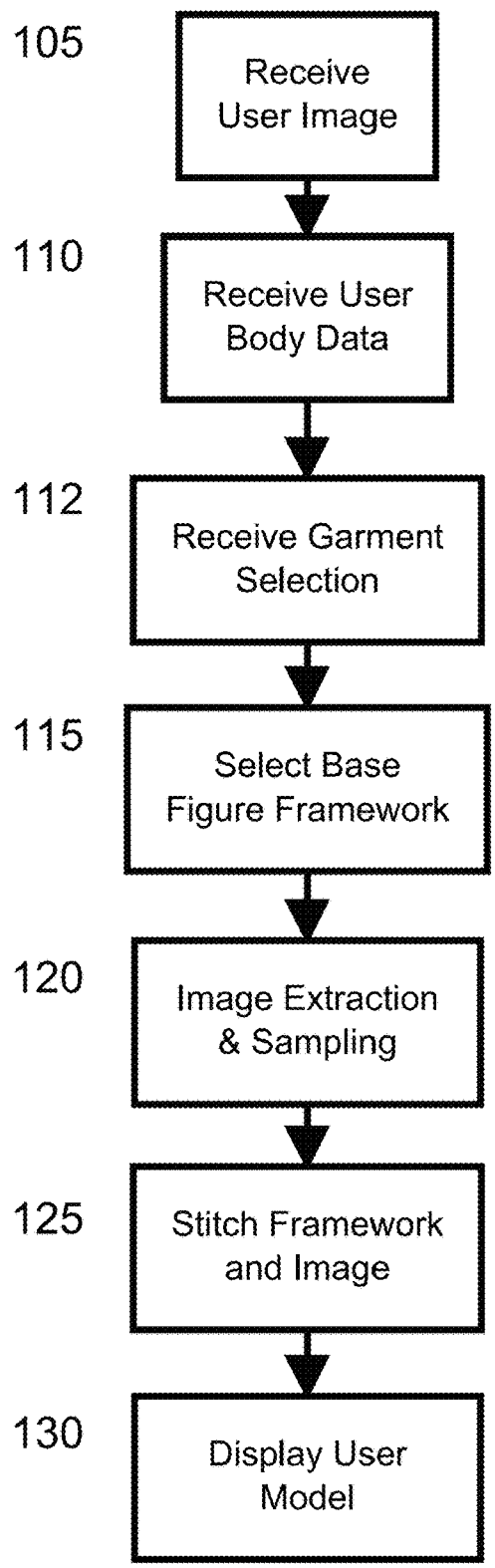
FIG. 3 depicts an alternate flowchart for the process of user model creation of FIG. 2.

Referring to FIG. 3, the user captures an image of a portion of himself or herself 105 using an optical camera 22, preferably, the upper body, more specifically above the shoulders. A suitable camera 22 includes a simple optical camera. The preferred vantage point is from the front of the user. The user may supplement the input with additional images from different vantage points. The photo extraction module 60 presents guides 54 55 for user placement and extracts the head 57 and neck 58 portion of the image.

At step 110, the system 10 presents an interface to the user. The user can input characteristics, such as height, weight, chest measurement, waist measurement, hip measurement, inseam, sleeve length, skin tone, eye color, hair color, and clothing sizes. The interface may also present simplified or derived options to the user. For example, the system may present "banana", "apple", "pear", "hourglass", or "athletic" or as "body type" options. This signals the system to apply certain body characteristics, such as certain bust-hip ratios, waist-hip ratios, or torso length to leg length ratios. The user information is stored as a profile in the user model database 34.

At step 112 the user selects a garment 38 to "model." The system 10 stores the garment 38 selection.

At step 115, the system 10 selects a base figure framework 40 based upon the user input. As mentioned, one configuration of the user model data database 34 includes a dictionary of base figure frameworks 40 of varying body measurements and characteristics representing different cross-sections of the population. Where the system 10 is configured with a broad base figure framework dictionary, the system 10 selects the base figure framework 40 which most closely matches the user based on the user image and user profile data. The system 10 determines the degree of correlation to other base figure frameworks for other user inputs and information derived from user input. The system 10 selects the available base figure framework 40 with the highest aggregation correlation.

Optionally, the system is configured to retrieve or scale a base figure framework 40 representative of the user having an altered weight facade. That is to say, the base figure framework 40 may represent a user if that user gains or loses weight. In this optionally approach, the system 10 selects the base figure framework 40 as disclosed. Then the system 10 combines user input with predictive weight change attributes to select a base figure framework 40. For example, people with a lower torso length to leg length ratios may have a higher tendency to initially expand at the hip in weight gain. The system preferably employs such tendencies to aid base figure framework 40 selection.

The photo extraction module extracts the head 57 and neck 58 portion from the user image, followed by image color sampling by the colorization module 120.

The stitching module 70 joins the user head 57 and neck 58 to the base figure framework 125 to form the base user model 11. The rendered user model is stored in the user model database 34.

Figure 5:
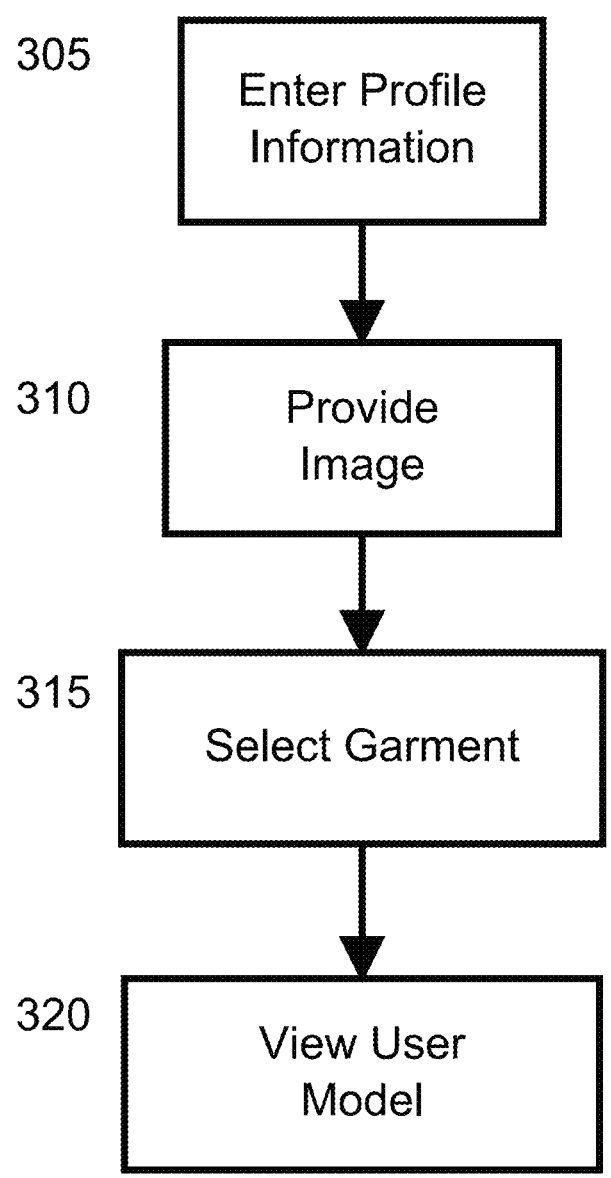
FIG. 5 depicts a flowchart for the process of user interaction with the system.
Figure 16:
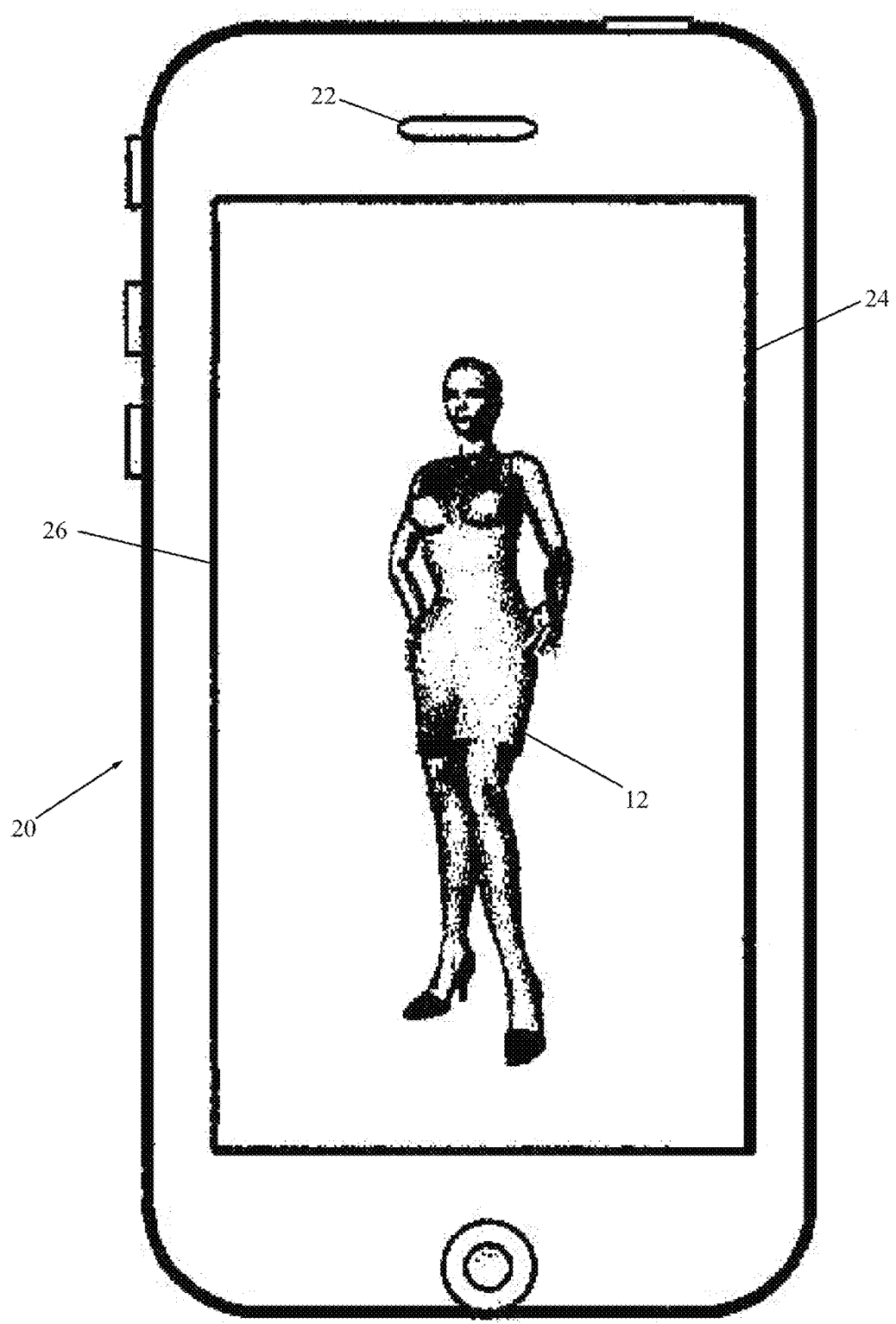
FIG. 16 depicts a user model as it may exist on a display.

Referring to FIG. 5, the process of a user simulating modeling or "trying on" a garment 38 is shown. First, the rendered user model is received 305. The user selects a garment 310. The system maps the garment to the user model 315, using the pairing data and body reference data to associate regions of the selected garment to regions of the user model. The user selected garment is scaled and overlaid on the user model according to the system generated user model and the user selected garment, correlating garment regions to user model regions. At step 315, the simulated model is displayed to the video screen 24, as shown in FIG. 16.

Insofar as the description above and the accompanying drawings disclose any additional subject matter, the inventions are not dedicated to the public and the right to file one or more applications to claim such additional inventions is reserved.

What is claimed is:

1. A system for simulating a user modeling a garment comprising:
   a photo extraction module, a stitching display module, and a model display module;
   said photo extraction module configured to extract a head and neck region from a user provided image of optical camera data;
   said photo extraction module selectively sampling a facial region, selectively sampling said background region, generating a blended region comprised of said sampled facial region and said sampled background region, and interposing said blended region between said facial region and said background region,
   wherein a first transparency value is assigned to said sampled facial region and a second transparency value is assigned to said sampled background region, and said blended region comprises said sampled regions overlaid proportional to said first transparency value for said sampled facial region and said second transparency for said sampled background region;
   said colorization module configured to extract color frequency data from a sample area within said head region of said extracted user provided image for application to a base figure framework, said color frequency data comprising a distribution of colors in said sample area;
   the system configured to select and scaling a base figure framework in response to user profile input;
   said stitching module configured to join said extracted head and neck region to the neck region of said selected base figure framework to output a base user model;
   said model display module overlaying and scaling a selected garment on said base user model, wherein a first transparency value is assigned to a portion of said user neck and a second transparency value is assigned to a portion of said framework neck, and said blended region comprises said neck regions overlaid proportional to said first transparency value for said user neck and said second transparency for said framework neck;

said model display module rendering a simulated three dimensional user model by processing said base user model employing a normal mapping based approach, shading said user model based exclusively on diffuse color and specular color colorization module data.

2. A method of simulating a user modeling a garment comprising the steps of:

receiving a user image, a garment selection, and a user profile;

a photo extraction module extracting a head and neck region from said user image;

a colorization module extracting color frequency data from a sample area within said head region of said extracted user image for application to a base figure framework, said color frequency data comprising a distribution of colors in said sample area;

selecting and scaling a base figure framework in response to user profile;

a stitching module joining said extracted head and neck region to the neck region of said selected base figure framework to output a base user model;

a model display module overlaying and scaling said selected garment on said base user model;

a model display module rendering a simulated three dimensional user model, shading said user model based on colorization module data, whereby the model display module simulates said user wearing said selected garment;

wherein a first transparency value is assigned to said sampled facial region and a second transparency value is assigned to said sampled background region, and said blended region comprises said sampled regions overlaid proportional to said first transparency value for said sampled facial region and said second transparency for said sampled background region.

3. A method of simulating a user modeling a garment comprising the steps of:

receiving a user image, a garment selection, and a user profile;

a photo extraction module extracting a head and neck region from said user image;

a colorization module extracting color frequency data from a sample area within said head region of said extracted user image for application to a base figure framework, said color frequency data comprising a distribution of colors in said sample area;

selecting and scaling a base figure framework in response to user profile;

a stitching module joining said extracted head and neck region to the neck region of said selected base figure framework to output a base user model;

a model display module overlaying and scaling said selected garment on said base user model;

a model display module rendering a simulated three dimensional user model, shading said user model based on colorization module data, whereby the model display module simulates said user wearing said selected garment;

wherein said stitching module creates a blend region disposed between the user neck and the base figure framework neck, said stitching model selectively sampling said user neck and said base figure framework neck, in order to generate said blended region;

wherein a first transparency value is assigned to a portion of said user neck and a second transparency value is assigned to a portion of said framework neck, and said blended region comprises said neck regions overlaid proportional to said first transparency value for said sampled user neck and said second transparency for said sampled framework neck.

4. A system for simulating a user modeling a garment comprising:

a photo extraction module, a stitching display module, and a model display module;

said photo extraction module configure to extract the head and neck region from a user provided image;

said colorization module configured to extract color frequency data from said extracted user provided image for application to a base figure framework;

the system configured to select and scaling a base figure framework in response to user profile input;

said stitching module configured to join said extracted head and neck region to the neck region of said selected base figure framework to output a base user model;

said model display module overlaying and scaling a selected garment on said base user model;

said model display module rendering a simulated three dimensional user model, shading said user model based on colorization module data, whereby the system simulates said user wearing said selected garment;

wherein a first transparency value is assigned to said sampled facial region and a second transparency value is assigned to said sampled background region, and said blended region comprises said sampled regions overlaid according proportional to said first transparency value for said sampled facial region and said second transparency for said sampled background region.

5. A system for simulating a user modeling a garment comprising:

a photo extraction module, a stitching display module, and a model display module;

said photo extraction module configure to extract the head and neck region from a user provided image;

said colorization module configured to extract color frequency data from said extracted user provided image for application to a base figure framework;

the system configured to select and scaling a base figure framework in response to user profile input;

said stitching module configured to join said extracted head and neck region to the neck region of said selected base figure framework to output a base user model;

said model display module overlaying and scaling a selected garment on said base user model;

said model display module rendering a simulated three dimensional user model, shading said user model based on colorization module data, whereby the system simulates said user wearing said selected garment;

wherein said stitching module creates a blend region disposed between the user neck and the base figure framework neck, said stitching model selectively sampling said user neck and said base figure framework neck, in order to generate said blended region;

wherein a first transparency value is assigned to a portion of said user neck and a second transparency value is assigned to a portion of said framework neck, and said blended region comprises said neck regions overlaid proportional to said first transparency value for said sampled user neck and said second transparency for said sampled framework neck.

* * * * *